(12) United States Patent
Em

(10) Patent No.: US 10,347,326 B2
(45) Date of Patent: Jul. 9, 2019

(54) RESISTIVE MEMORY APPARATUS WITH A SINGLE READ/WRITE DRIVER

(71) Applicant: SK hynix Inc., Icheon-si Gyeonggi-do (KR)

(72) Inventor: Ho Seok Em, Hwaseong-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/672,697

(22) Filed: Aug. 9, 2017

(65) Prior Publication Data

US 2018/0047441 A1 Feb. 15, 2018

(30) Foreign Application Priority Data

Aug. 10, 2016 (KR) .................. 10-2016-0101931

(51) Int. Cl.
| | |
|---|---|
| *G11C 7/10* | (2006.01) |
| *G11C 11/419* | (2006.01) |
| *G11C 7/14* | (2006.01) |
| *G11C 11/4096* | (2006.01) |
| *G11C 7/12* | (2006.01) |
| *G11C 7/22* | (2006.01) |

(52) U.S. Cl.
CPC .......... *G11C 11/419* (2013.01); *G11C 7/1006* (2013.01); *G11C 7/1045* (2013.01); *G11C 7/1048* (2013.01); *G11C 7/12* (2013.01); *G11C 7/14* (2013.01); *G11C 7/22* (2013.01); *G11C 11/4096* (2013.01)

(58) Field of Classification Search
CPC ... G11C 11/419; G11C 7/1006; G11C 7/1045; G11C 7/1048
See application file for complete search history.

(56) References Cited

U.S. PATENT DOCUMENTS

| | | | | |
|---|---|---|---|---|
| 6,161,134 | A * | 12/2000 | Wang ............... | G06F 1/1632 709/220 |
| 7,894,236 | B2 * | 2/2011 | Oh .................. | G11C 5/145 365/148 |
| 8,605,517 | B2 * | 12/2013 | Choi ................ | G11C 7/22 365/185.2 |

(Continued)

FOREIGN PATENT DOCUMENTS

KR   1020140080942 A   7/2014

*Primary Examiner* — Mushfique Siddique
(74) *Attorney, Agent, or Firm* — William Park & Associates Ltd.

(57) ABSTRACT

A semiconductor memory apparatus includes a bias voltage generation circuit configured to generate a bias voltage according to a read voltage or a write voltage in response to a read signal and a write signal, a data discrimination circuit configured to generate a set enable signal and a reset enable signal in response to data and the write signal. The semiconductor memory apparatus also includes a current selection circuit configured to generate a first current in response to the read signal, the set enable signal, and the reset enable signal. The semiconductor memory apparatus further includes a driver configured to receive the first current and generate a second current in response to a voltage level of the bias voltage, and a first switch configured to provide the second current to a memory cell in response to the read signal and the write signal.

19 Claims, 4 Drawing Sheets

(56) References Cited

U.S. PATENT DOCUMENTS

| | | | | |
|---|---|---|---|---|
| 2007/0159146 A1* | 7/2007 | Mandal | ............... | G05F 1/575 323/280 |
| 2009/0231930 A1* | 9/2009 | Kang | ............... | G11C 5/147 365/189.07 |
| 2012/0051127 A1* | 3/2012 | Yoon | ............... | G11C 13/0004 365/163 |
| 2014/0177353 A1* | 6/2014 | Park | ............... | G11C 13/0002 365/189.14 |
| 2014/0177368 A1* | 6/2014 | Ahn | ............... | G11C 7/12 365/207 |
| 2014/0301148 A1* | 10/2014 | Yoon | ............... | G11C 7/22 365/189.03 |
| 2015/0036441 A1* | 2/2015 | Jin | ............... | G11C 5/147 365/189.07 |
| 2015/0124546 A1* | 5/2015 | Son | ............... | G11C 5/147 365/226 |

* cited by examiner

RESISTIVE MEMORY APPARATUS WITH A SINGLE READ/WRITE DRIVER

CROSS-REFERENCES TO RELATED APPLICATION

The present application claims priority under 35 U.S.C. § 119(a) to Korean application number 10-2016-0101931, filed on Aug. 10, 2016, in the Korean Intellectual Property Office, which is incorporated herein by reference in its entirety.

BACKGROUND

1. Technical Field

Various embodiments generally relate to a semiconductor integrated circuit, and, more particularly, to a semiconductor memory apparatus.

2. Related Art

Semiconductor memory apparatuses are configured to receive and store data and output stored data.

Semiconductor memory apparatuses are divided into a volatile semiconductor memory apparatus which stores data only when a power supply voltage is applied to the semiconductor memory apparatus and a nonvolatile semiconductor memory apparatus which stores data even when application of a power supply voltage is cut off.

SUMMARY

In an embodiment, a semiconductor memory apparatus may include: a bias voltage generation circuit configured to generate a bias voltage according to a read voltage or a write voltage in response to a read signal and a write signal; a data discrimination circuit configured to generate a set enable signal and a reset enable signal in response to data and the write signal; a current selection circuit configured to generate a first current in response to the read signal, the set enable signal and the reset enable signal; a driver configured to receive the first current, and generate a second current in response to a voltage level of the bias voltage; and a first switch configured to provide the second current to a memory cell in response to the read signal and the write signal.

In an embodiment, a semiconductor memory apparatus may include: a driver configured to generate a current corresponding to a voltage level of a bias voltage, and provide the current to a memory cell; a reference voltage selection circuit configured to output one of a read voltage and a write voltage as a reference voltage in response to a read signal and a write signal; a comparison circuit configured to compare voltage levels of the reference voltage and a feedback voltage, and generate the bias voltage; and a selection circuit configured to output the bias voltage as the feedback voltage or output a voltage formed between the driver and the memory cell as the feedback voltage, in response to the read signal.

DETAILED DESCRIPTION

Hereinafter, a semiconductor memory apparatus will be described below with reference to the accompanying drawings through various example embodiments.

Figure 1:
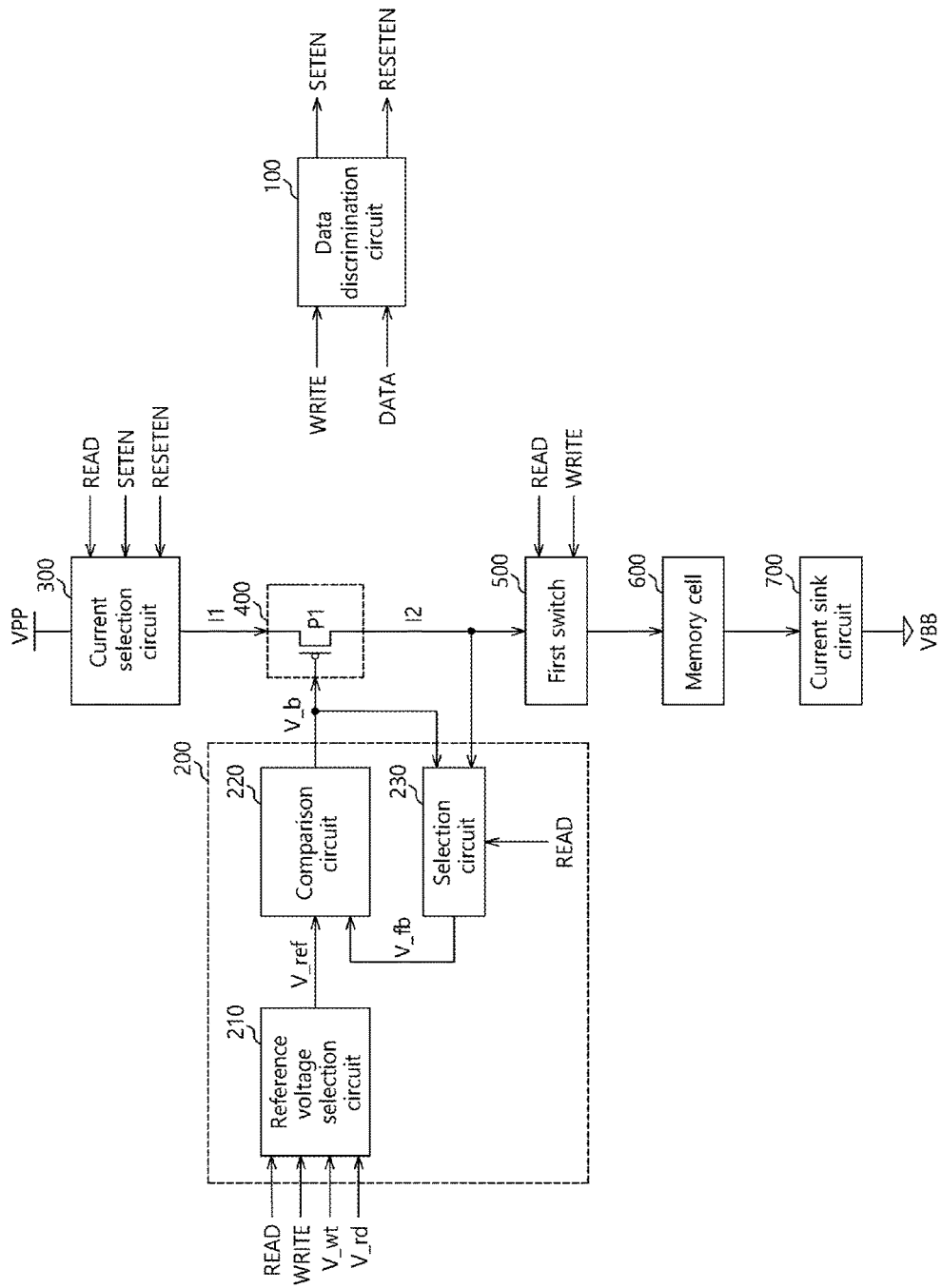
FIG. 1 is a configuration diagram illustrating a representation of an example of a semiconductor memory apparatus in accordance with an embodiment.

As shown in FIG. 1, a semiconductor memory apparatus in accordance with an embodiment may include a data discrimination circuit 100, a bias voltage generation circuit 200, a current selection circuit 300, a driver 400, a first switch 500, a memory cell 600, and a current sink circuit 700.

The data discrimination circuit 100 may generate a set enable signal SETEN and a reset enable signal RESETEN in response to a write signal WRITE and data DATA. For example, the data discrimination circuit 100 may enable one of the set enable signal SETEN and the reset enable signal RESETEN in response to the level of the data DATA when the write signal WRITE is enabled. In detail, the data discrimination circuit 100 enables the set enable signal SETEN in the case where the write signal WRITE is enabled and the data DATA is a first level. The data discrimination circuit 100 enables the reset enable signal RESETEN in the case where the write signal WRITE is enabled and the data DATA is a second level.

The bias voltage generation circuit 200 may generate a bias voltage V_b according to a read voltage V_rd or a write voltage V_wt in response to a read signal READ and a write signal WRITE. For example, the bias voltage generation circuit 200 may generate the bias voltage V_b in response to the voltage level of the read voltage V_rd when the read signal READ is enabled. The bias voltage generation circuit 200 may generate the bias voltage V_b in response to the voltage level of the write voltage V_wt when the write signal WRITE is enabled.

The bias voltage generation circuit 200 may include a reference voltage selection circuit 210, a comparison circuit 220, and a selection circuit 230.

The reference voltage selection circuit 210 may generate a reference voltage V_ref in response to the read signal READ, the write signal WRITE, the write voltage V_wt, and the read voltage V_rd. For example, the reference voltage selection circuit 210 may output one of the write voltage V_wt and the read voltage V_rd, as the reference voltage V_ref, in response to the read signal READ and the write signal WRITE. In detail, the reference voltage selection circuit 210 may output the read voltage V_rd as the reference voltage V_ref when the read signal READ is enabled, and output the write voltage V_wt as the reference voltage V_ref when the write signal WRITE is enabled.

The comparison circuit 220 may generate the bias voltage V_b in response to the reference voltage V_ref and a feedback voltage V_fb. For example, the comparison circuit 220 may compare the voltage levels of the reference voltage V_ref and the feedback voltage V_fb, and generate the bias voltage V_b.

The selection circuit 230 may output one of the bias voltage V_b and output voltage of the driver 400, as the feedback voltage V_fb, in response to the read signal READ. For example, the selection circuit 230 outputs the bias voltage V_b as the feedback voltage V_fb if the read signal READ is enabled. The selection circuit 230 may output the output voltage of the driver 400, as the feedback voltage V_fb, if the read signal READ is disabled. Alternatively, the selection circuit 230 may output the voltage formed between the driver 400 and the memory cell 600 as the feedback voltage V_fb, if the read signal READ is disabled. The selection circuit 230 may be constructed of a multiplexer or switching elements.

The current selection circuit 300 may generate a first current I1 in response to the read signal READ, the set enable signal SETEN, and the reset enable signal RESETEN. For example, the current selection circuit 300 may provide to the driver 400 the first current I1 having a current amount corresponding to each of the read signal READ, the set enable signal SETEN, and the reset enable signal RESETEN.

The driver 400 may receive the first current I1, and generate a second current I2 in response to the bias voltage V_b. For example, the driver 400 may output all or a portion of the first current I1 as the second current I2 to the memory cell 600 via the first switch 500 in response to the voltage level of the bias voltage V_b.

The driver 400 may include a first transistor P1. The first transistor P1 has a gate to which the bias voltage V_b is applied, a source which receives the first current I1, and a drain which outputs the second current I2.

The first switch 500 may provide the second current I2 to the memory cell 600 in response to the read signal READ and the write signal WRITE. For example, the first switch 500 may turned on to provide the second current I2 to the memory cell 600 when either one of the read signal READ and the write signal WRITE is enabled.

The current sink circuit 700 may be configured to cause a predetermined amount of current to flow from the memory cell 600 to a first ground terminal VBB. The voltage level of the first ground terminal VBB may be a negative voltage.

Figure 2:
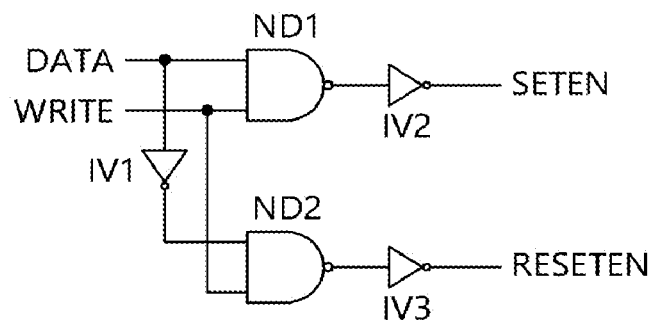
FIG. 2 is a configuration diagram illustrating a representation of an example of a data discrimination circuit shown in FIG. 1.

As shown in FIG. 2, the data discrimination circuit 100 may include first to third inverters IV1, IV2, and IV3 and first and second NAND gates ND1 and ND2. The first inverter IV1 receives the data DATA. The first NAND gate ND1 receives the data DATA and the write signal WRITE. The second NAND gate ND2 receives the output signal of the first inverter IV1 and the write signal WRITE. The second inverter IV2 receives the output signal of the first NAND gate ND1 and outputs the set enable signal SETEN. The third inverter IV3 receives the output signal of the second NAND gate ND2 and outputs the reset enable signal RESETEN.

The data discrimination circuit 100 in accordance with an embodiment, configured in this way, enables the set enable signal SETEN to a high level when the write signal WRITE is enabled to a high level and the data DATA is a high level. The data discrimination circuit 100 enables the reset enable signal RESETEN to a high level when the write signal WRITE is enabled to the high level and the data DATA is a low level. The data discrimination circuit 100 disables the set enable signal SETEN and the reset enable signal RESETEN to a low level regardless of the data DATA when the write signal WRITE is disabled to a low level.

Figure 3:
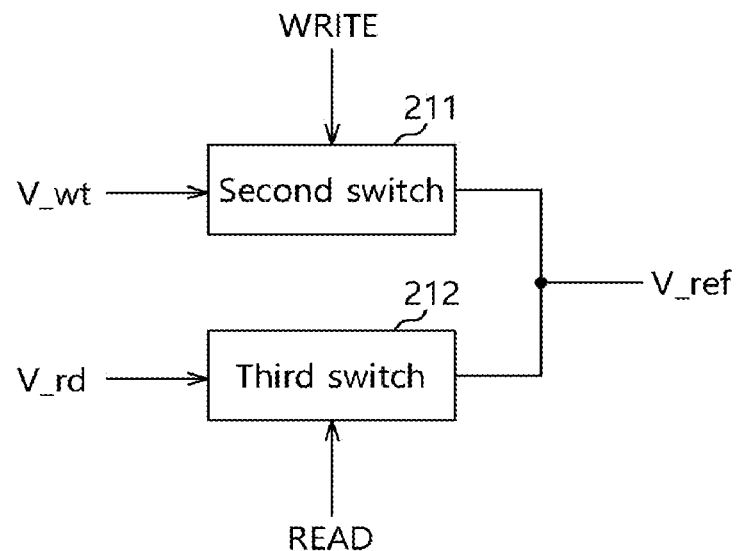
FIG. 3 is a configuration diagram illustrating a representation of an example of a reference voltage selection circuit shown in FIG. 1.

As shown in FIG. 3, the reference voltage selection circuit 210 may include second and third switches 211 and 212. The second switch 211 outputs the write voltage V_wt as the reference voltage V_ref when the write signal WRITE is enabled. The third switch 212 outputs the read voltage V_rd as the reference voltage V_ref when the read signal READ is enabled.

Figure 4:
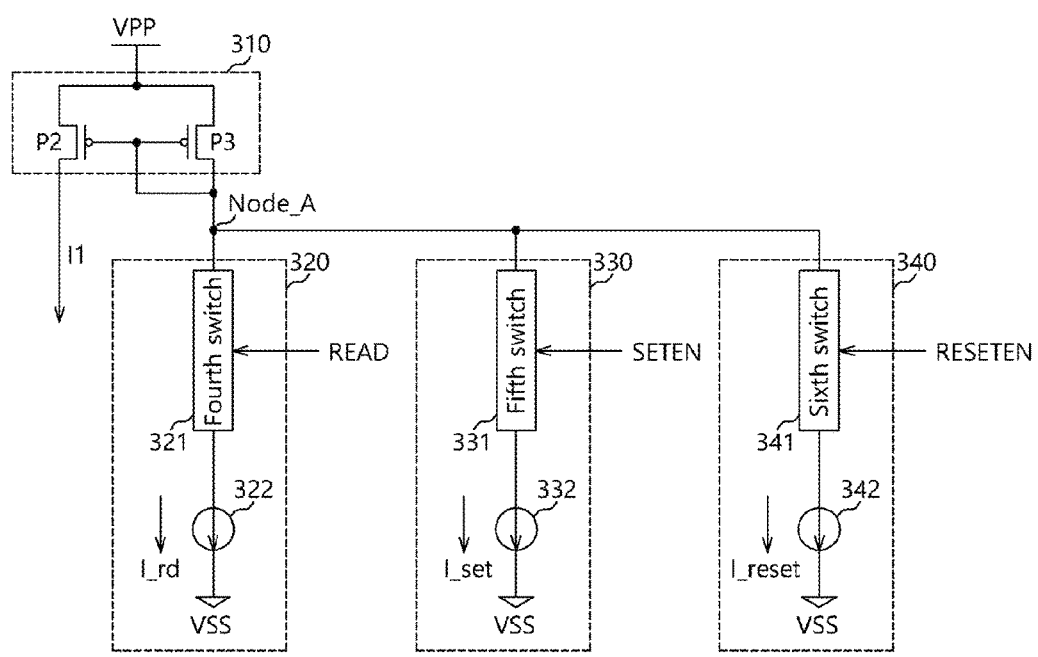
FIG. 4 is a configuration diagram illustrating a representation of an example of a current selection circuit shown in FIG. 1.

As shown in FIG. 4, the current selection circuit 300 may include a current mirror circuit 310, a read current circuit 320, a set current circuit 330, and a reset current circuit 340.

The current mirror circuit 310 may be configured to output the first current I1 having a current amount corresponding to an amount of current which flows out from a node Node_A.

The current mirror circuit 310 may include second and third transistors P2 and P3. The second transistor P2 has a gate to which the node Node_A is coupled, a source which is applied with a high voltage VPP, and a drain which outputs the first current I1. The third transistor P3 has a gate to which the node Node_A is coupled, a source which is applied with the high voltage VPP, and a drain to which the node Node_A is coupled.

The read current circuit 320 may be configured to cause a read current I_rd having a first predetermined current amount to flow from the node Node_A to a second ground terminal VSS, in response to the read signal READ which may be enabled. The voltage level of the second ground terminal VSS may be a ground voltage.

The read current circuit 320 may include a fourth switch 321 and a first current source 322.

The fourth switch 321 may couple or decouple the node Node_A and the first current source 322 in response to the read signal READ. For example, the fourth switch 321 couples the node Node_A to the first current source 322 when the read signal READ is enabled, and decouples the node Node_A from the first current source 322 when the read signal READ is disabled.

The first current source 322 causes the read current I_rd to flow from the node Node_A to the second ground terminal VSS, when the second ground terminal VSS is coupled to the node Node_A through the fourth switch 321.

The set current circuit 330 may be configured to cause a set current I_set having a second predetermined current amount to flow from the node Node_A to the second ground terminal VSS, in response to the set enable signal SETEN which may be enabled.

The set current circuit 330 may include a fifth switch 331 and a second current source 332.

The fifth switch 331 may couple or decouple the node Node_A and the second current source 322 in response to the set enable signal SETEN. For example, the fifth switch 331 couples the node Node_A to the second current source 332 when the set enable signal SETEN is enabled, and decouples the node Node_A from the second current source 332 when the set enable signal SETEN is disabled.

The second current source 332 causes the set current I_set to flow from the node Node_A to the second ground terminal VSS, when the second ground terminal VSS is coupled to the node Node_A through the fifth switch 331.

The reset current circuit 340 may be configured to cause a reset current I_reset having a third predetermined current amount to flow from the node Node_A to the second ground terminal VSS, in response to the reset enable signal RESETEN which may be enabled.

The reset current circuit 340 may include a sixth switch 341 and a third current source 342.

The sixth switch 341 may couple or decouple the node Node_A and the third current source 342 in response to the reset enable signal RESETEN. For example, the sixth switch 341 couples the node Node_A to the third current source 342 when the reset enable signal RESETEN is enabled, and decouples the node Node_A from the third current source 342 when the reset enable signal RESETEN is disabled.

The third current source 342 causes the reset current I_reset to flow from the node Node_A to the second ground terminal VSS, when the second ground terminal VSS is coupled to the node Node_A through the sixth switch 341.

The current selection circuit 300 configured in this way operates as follows.

If at least one of the read signal READ is enabled and the read current I_rd flows from the node Node_A to the second ground terminal VSS, the current selection circuit 300 outputs the first current I1 having a current amount corresponding to the read current I_rd.

If at least one of the set enable signal SETEN is enabled and the set current I_set flows from the node Node_A to the second ground terminal VSS, the current selection circuit 300 outputs the first current I1 having a current amount corresponding to the set current I_set.

If at least one of the reset enable signal RESETEN is enabled and the reset current I_reset flows from the node Node_A to the second ground terminal VSS, the current selection circuit 300 outputs the first current I1 having a current amount corresponding to the reset current I_reset.

The semiconductor memory apparatus in accordance with the embodiment, configured as mentioned above, operates as follows.

An operation in which a current is applied to the memory cell 600 in a read operation will be described below.

The data discrimination circuit 100 disables both the set enable signal SETEN and the reset enable signal RESETEN in response to the write signal WRITE which is disabled in the read operation.

The reference voltage selection circuit 210 outputs the read voltage V_rd as the reference voltage V_ref in response to the read signal READ which is enabled.

The comparison circuit 220 compares the voltage levels of the reference voltage V_ref and the feedback voltage V_fb, and generates the bias voltage V_b.

The selection circuit 230 outputs the bias voltage V_b as the feedback voltage V_fb in response to the read signal READ which is enabled.

Therefore, the bias voltage generation circuit 200 including the reference voltage selection circuit 210, the comparison circuit 220, and the selection circuit 230 generates the bias voltage V_b which has a voltage level corresponding to the voltage level of the read voltage V_rd, in response to the read signal READ which is enabled in the read operation.

The current selection circuit 300 outputs the first current I1 having a current amount corresponding to the read signal READ which is enabled, that is, a current amount corresponding to the current amount of the read current I_rd.

The driver 400 receives the first current I1, and outputs all or a portion of the first current I1 as the second current I2 in response to the voltage level of the bias voltage V_b.

The first switch 500 is turned on in response to the read signal READ which is enabled, and provides the second current I2 to the memory cell 600.

The current sink circuit 700 causes the second current I2 to flow from the memory cell 600 to the first ground terminal VBB.

Therefore, the read voltage V_rd and the second current I2 having a current amount corresponding to the read current I_rd flow through the memory cell 600.

An operation in which a current is applied to the memory cell 600 in a write operation will be described below.

First, a description will be made for the case where the data DATA has the high level in the write operation.

The data discrimination circuit 100 enables one of the set enable signal SETEN and the reset enable signal RESETEN in response to the data DATA when the write signal WRITE is enabled in the write operation. The data discrimination circuit 100 enables the set enable signal SETEN when the write signal WRITE is enabled and the data DATA is the high level.

The reference voltage selection circuit 210 outputs the write voltage V_wt as the reference voltage V_ref in response to the write signal WRITE which is enabled.

The comparison circuit 220 compares the voltage levels of the reference voltage V_ref and the feedback voltage V_fb, and generates the bias voltage V_b.

The selection circuit 230 outputs a voltage formed between the driver 400 and the first switch 500, that is, a voltage having a voltage level corresponding to the second current I2 outputted from the driver 400, as the feedback voltage V_fb, in response to the read signal READ which is disabled.

Therefore, the bias voltage generation circuit 200 including the reference voltage selection circuit 210, the comparison circuit 220, and the selection circuit 230 generates the bias voltage V_b in response to the write signal WRITE which is enabled in the write operation, such that a voltage having a voltage level corresponding to the voltage level of the write voltage V_wt may be formed between the driver 400 and the first switch 500.

The current selection circuit 300 outputs the first current I1 having a current amount corresponding to the set enable signal SETEN which is enabled, that is, a current amount corresponding to the current amount of the set current I_set.

The driver 400 receives the first current I1, and outputs all or a portion of the first current I1 as the second current I2 in response to the voltage level of the bias voltage V_b. The second current I2 has a current amount that allows a voltage formed between the driver 400 and the first switch 500 to have a voltage level corresponding to the write voltage V_wt.

The first switch 500 is turned on in response to the write signal WRITE which is enabled, and provides the second current I2 to the memory cell 600.

The current sink circuit 700 causes the second current I2 to flow from the memory cell 600 to the first ground terminal VBB.

Therefore, the write voltage V_wt and the second current I2 having a current amount corresponding to the set current I_set flow through the memory cell 600.

Next, descriptions will be made for the case where the data DATA is the low level in the write operation.

The data discrimination circuit 100 enables one of the set enable signal SETEN and the reset enable signal RESETEN in response to the data DATA when the write signal WRITE is enabled in the write operation. The data discrimination circuit 100 enables the reset enable signal RESETEN when the write signal WRITE is enabled and the data DATA is the low level.

The reference voltage selection circuit 210 outputs the write voltage V_wt as the reference voltage V_ref in response to the write signal WRITE which is enabled.

The comparison circuit 220 compares the voltage levels of the reference voltage V_ref and the feedback voltage V_fb, and generates the bias voltage V_b.

The selection circuit 230 outputs a voltage formed between the driver 400 and the first switch 500, that is, a voltage having a voltage level corresponding to the second current I2 outputted from the driver 400, as the feedback voltage V_fb, in response to the read signal READ which is disabled.

Therefore, the bias voltage generation circuit 200 including the reference voltage selection circuit 210, the comparison circuit 220, and the selection circuit 230 generates the bias voltage V_b in response to the write signal WRITE which is enabled in the write operation, such that a voltage having a voltage level corresponding to the voltage level of the write voltage V_wt may be formed between the driver 400 and the first switch 500.

The current selection circuit 300 outputs the first current I1 having a current amount corresponding to the reset enable signal RESETEN which is enabled, that is, a current amount corresponding to the current amount of the reset current I_reset.

The driver 400 receives the first current I1, and outputs all or a portion of the first current I1 as the second current I2 in response to the voltage level of the bias voltage V_b. The second current I2 has a current amount that allows a voltage formed between the driver 400 and the first switch 500 to have a voltage level corresponding to the write voltage V_wt.

The first switch 500 is turned on in response to the write signal WRITE which is enabled, and provides the second current I2 to the memory cell 600.

The current sink circuit 700 causes the second current I2 to flow from the memory cell 600 to the first ground terminal VBB.

Therefore, the write voltage V_wt and the second current I2 having a current amount corresponding to the reset current I_reset flow through the memory cell 600.

As is apparent from the above descriptions, in a semiconductor memory apparatus in accordance with an embodiment, because a current to be provided to a memory cell in a read operation or a write operation is provided through the same driver, space efficiency may be improved.

While various embodiments have been described above, it will be understood to those skilled in the art that the embodiments described are examples only. Accordingly, the semiconductor memory apparatus described herein should not be limited based on the described embodiments.

Figure 5:
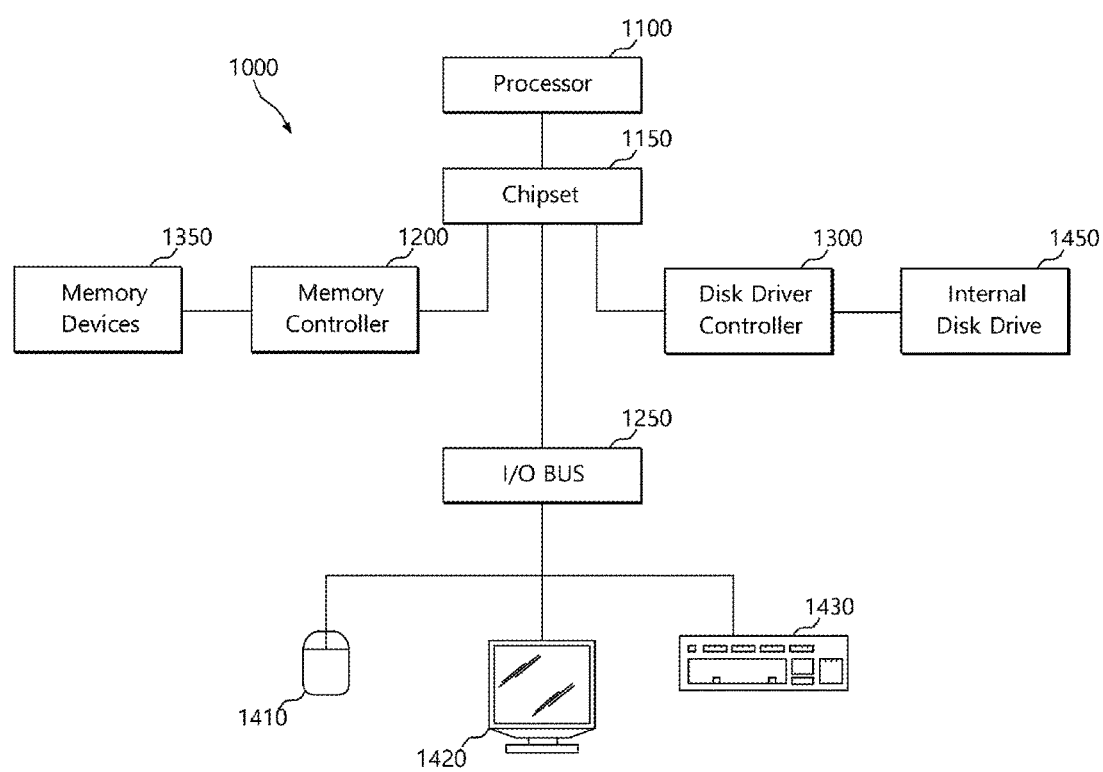
FIG. 5 illustrates a block diagram of an example system employing a semiconductor memory apparatus in accordance with the various embodiments discussed above with relation to FIGS. 1-4.

The semiconductor memory apparatus discussed above (see FIGS. 1-4) are particularly useful in the design of memory devices, processors, and computer systems. For example, referring to FIG. 5, a block diagram of a system employing a semiconductor memory apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor memory apparatus as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor memory apparatus as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a system 1000 employing a semiconductor memory apparatus as discussed above with relation to FIGS. 1-4. In alternate embodiments, such as, for example but not limited to, cellular phones or digital cameras, the components may differ from the embodiments illustrated in FIG. 5.

What is claimed is:

1. A semiconductor memory apparatus comprising:
a bias voltage generation circuit configured to generate a bias voltage according to a read voltage or a write voltage in response to a read signal and a write signal;
a data discrimination circuit configured to generate a set enable signal and a reset enable signal in response to data and the write signal;

a current selection circuit configured to generate a first current in response to the read signal, the set enable signal, and the reset enable signal;

a driver configured to receive the first current, and generate a second current in response to a voltage level of the bias voltage; and a first switch configured to provide the second current to a memory cell in response to the read signal and the write signal, wherein the bias voltage generation circuit includes a selection circuit configured to output the bias voltage as a feedback voltage when the read signal is enabled and output a voltage formed between the driver and the memory cell as the feedback voltage when the read signal is disabled.

2. The semiconductor memory apparatus according to claim 1, wherein:

the bias voltage generation circuit generates the bias voltage in response to a voltage level of the read voltage when the read signal is enabled; and the bias voltage generation circuit generates the bias voltage when the write signal is enabled, such that the voltage formed between the driver and the first switch corresponds to a voltage level of the write voltage.

3. The semiconductor memory apparatus according to claim 1, wherein the bias voltage generation circuit comprises:

a reference voltage selection circuit configured to output one of the read voltage and the write voltage as a reference voltage in response to the read signal and the write signal;

a comparison circuit configured to compare voltage levels of the reference voltage and the feedback voltage, and generate the bias voltage.

4. The semiconductor memory apparatus according to claim 3, wherein the reference voltage selection circuit comprises:

a second switch configured to output the read voltage as the reference voltage when the read signal is enabled; and a third switch configured to output the write voltage as the reference voltage when the write signal is enabled.

5. The semiconductor memory apparatus according to claim 1, wherein the data discrimination circuit enables one of the set enable signal and the reset enable signal depending on a level of the data when the write signal is enabled.

6. The semiconductor memory apparatus according to claim 5, wherein the data discrimination circuit disables both the set enable signal and the reset enable signal regardless of the data when the write signal is disabled.

7. The semiconductor memory apparatus according to claim 1, wherein:

the current selection circuit outputs the first current having a current amount corresponding to a read current when the read signal is enabled;

the current selection circuit outputs the first current having a current amount corresponding to a set current when the set enable signal is enabled; and the current selection circuit outputs the first current having a current amount corresponding to a reset current when the reset enable signal is enabled.

8. The semiconductor memory apparatus according to claim 7, wherein the current selection circuit comprises:

a current mirror circuit configured to output the first current having a current amount corresponding to an amount of a current which flows out from a node;

a read current circuit configured to cause the read current to flow from the node to a ground terminal when the read signal is enabled;

a set current circuit configured to cause the set current to flow from the node to the ground terminal when the set enable signal is enabled; and a reset current circuit configured to cause the reset current to flow from the node to the ground terminal when the reset enable signal is enabled.

9. The semiconductor memory apparatus according to claim 1, wherein the first switch is turned on when either one of the read signal and the write signal is enabled, and transfers the second current to the memory cell.

10. The semiconductor memory apparatus according to claim 9, wherein a current sink circuit allows the second current to flow from the memory cell to a ground terminal.

11. The semiconductor memory apparatus according to claim 1, wherein the second current generated by the driver corresponds to the voltage level of the bias voltage.

12. A semiconductor memory apparatus comprising:

a driver configured to generate a current corresponding to a voltage level of a bias voltage, and provide the current to a memory cell;

a reference voltage selection circuit configured to output one of a read voltage and a write voltage as a reference voltage in response to a read signal and a write signal;

a comparison circuit configured to compare voltage levels of the reference voltage and a feedback voltage, and generate the bias voltage; and a selection circuit configured to output the bias voltage as the feedback voltage when the read signal is enabled and output a voltage formed between the driver and the memory cell as the feedback voltage when the read signal is disabled.

13. The semiconductor memory apparatus according to claim 12, wherein:

the reference voltage selection circuit outputs the read voltage as the reference voltage when the read signal is enabled; and the reference voltage selection circuit outputs the write voltage as the reference voltage when the write signal is enabled.

14. The semiconductor memory apparatus according to claim 12, further comprising:

a data discrimination circuit configured to generate a set enable signal and a reset enable signal in response to the write signal and data; and a current selection circuit configured to provide a current having a current amount corresponding to each of the read signal, the set enable signal and the reset enable signal, to the driver.

15. The semiconductor memory apparatus according to claim 14, wherein the data discrimination circuit enables one of the set enable signal and the reset enable signal in response to a level of the data when the write signal is enabled.

16. The semiconductor memory apparatus according to claim 14, wherein:

the current selection circuit generates a current having a current amount corresponding to a read current when the read signal is enabled;

the current selection circuit generates a current having a current amount corresponding to a set current when the set enable signal is enabled; and the current selection circuit generates a current having a current amount corresponding to a reset current when the reset enable signal is enabled.

17. The semiconductor memory apparatus according to claim 14, wherein the current selection circuit comprises:
- a current mirror circuit configured to output a current having a current amount corresponding to an amount of current which flows out from a node;
- a read current circuit configured to cause the read current to flow from the node to a ground terminal when the read signal is enabled;
- a set current circuit configured to cause the set current to flow from the node to the ground terminal when the set enable signal is enabled; and
- a reset current circuit configured to cause the reset current to flow from the node to the ground terminal when the reset enable signal is enabled.

18. The semiconductor memory apparatus according to claim 12 wherein the driver is configured to provide the current to the memory cell via a switch.

19. The semiconductor memory apparatus according to claim 18, wherein the switch is turned on when either one of the read signal and the write signal is enabled, and the switch transfers the current to the memory cell.

* * * * *